United States Patent
Wu et al.

(10) Patent No.: US 9,450,619 B2
(45) Date of Patent: Sep. 20, 2016

(54) DYNAMIC LOG LIKELIHOOD RATIO QUANTIZATION FOR SOLID STATE DRIVE CONTROLLERS

(71) Applicant: LSI Corporation, San Jose, CA (US)

(72) Inventors: Yunxiang Wu, Cupertino, CA (US); Erich F. Haratsch, Bethlehem, PA (US)

(73) Assignee: Seagate Technology LLC, Cupertino, CA (US)

( * ) Notice: Subject to any disclaimer, the term of this patent is extended or adjusted under 35 U.S.C. 154(b) by 656 days.

(21) Appl. No.: 13/853,282

(22) Filed: Mar. 29, 2013

(65) Prior Publication Data

US 2014/0289450 A1    Sep. 25, 2014

Related U.S. Application Data

(60) Provisional application No. 61/804,265, filed on Mar. 22, 2013.

(51) Int. Cl.

| | |
|---|---|
| *G11C 29/00* | (2006.01) |
| *H03M 13/45* | (2006.01) |
| *G06F 11/10* | (2006.01) |
| *H03M 13/37* | (2006.01) |
| *H03M 13/00* | (2006.01) |
| *H03M 13/11* | (2006.01) |

(52) U.S. Cl.
CPC .......... *H03M 13/45* (2013.01); *G06F 11/1064* (2013.01); *H03M 13/3723* (2013.01); *H03M 13/612* (2013.01); *H03M 13/658* (2013.01); *H03M 13/6577* (2013.01); *H03M 13/1111* (2013.01)

(58) Field of Classification Search
CPC .......... G06F 11/1008; G06F 11/1064; G06F 11/1068; G06F 11/1072; G06F 11/1076; G06F 12/0246; G11C 29/00; H03M 13/1111; H03M 13/3723; H03M 13/3927; H03M 13/45; H03M 13/612; H03M 13/6577; H03M 13/658
See application file for complete search history.

(56) References Cited

U.S. PATENT DOCUMENTS

| | | | | |
|---|---|---|---|---|
| 8,270,543 | B1* | 9/2012 | Fattal | H04L 25/067 375/262 |
| 8,924,824 | B1* | 12/2014 | Lu | G06F 11/1048 365/185.2 |
| 9,059,742 | B1* | 6/2015 | Anderson | H03M 13/1111 |
| 2007/0086541 | A1* | 4/2007 | Moon | H03M 13/45 375/267 |
| 2007/0234178 | A1* | 10/2007 | Richardson | H04L 1/005 714/758 |
| 2010/0034018 | A1* | 2/2010 | Yang | G11C 11/5642 365/185.2 |
| 2011/0214039 | A1* | 9/2011 | Steiner | G06F 11/1012 714/797 |
| 2012/0297273 | A1* | 11/2012 | Sakaue | G06F 11/1048 714/773 |
| 2013/0173985 | A1* | 7/2013 | Chung | H03M 13/1111 714/755 |

* cited by examiner

*Primary Examiner* — Albert Decady
*Assistant Examiner* — Enamul M Kabir
(74) *Attorney, Agent, or Firm* — Suiter Swantz pc llo

(57) ABSTRACT

A method for system for dynamic channel Log Likelihood Ratio (LLR) quantization for a Solid State Drive (SSD) controller is a targeted approach to scaling which results in a scaled, quantized set of LLRs whose relative magnitude remains undisturbed from an original magnitude. The method reads a set of voltages from each channel of the SSD. The set of reads is configured in location and number for performance. Once a set is returned, the method determines an LLR for each of the voltages read resulting in a raw set of LLRs. Targeted scaling results in a scaled set of LLRs between an upper limit and a lower limit determined for reading by a decoder. Once scaled, the LLRs are rounded and quantized for use by the decoder to produce an Error Correction Code (ECC).

20 Claims, 5 Drawing Sheets

DYNAMIC LOG LIKELIHOOD RATIO QUANTIZATION FOR SOLID STATE DRIVE CONTROLLERS

CROSS REFERENCE TO RELATED APPLICATIONS

The present application claims the benefit under 35 U.S.C. §119(e) of United States Provisional Application Ser. No. 61/804,265 entitled "Dynamic Log Likelihood Ratio Quantization for Solid State Drive Controllers," filed Mar. 22, 2013, which is incorporated herein by reference in its entirety.

FIELD OF THE INVENTION

The present invention relates generally to analysis and correction of errors within Solid State Drive (SSD) flash devices. More particularly, embodiments of the present invention relate to targeted quantizing of specific error correction codes to simplify the correction process and provide high reliability and endurance of the SSD.

BACKGROUND

Some scaling schemes may blindly scale the Log Likelihood Ratio (LLR) values based on variable scaling factors. These blind scaling methods however, exclude a certain number of LLRs from the low density parity check (LDPC) decoding process leading to inaccurate results.

Therefore, a need remains for a system and method to accurately scale LLRs to a target range before LLR quantizing to yield an accurate and reasonable set of quantized LLRs. These highly accurate Error Correction Codes (ECCs) lead to better reliability and longer endurance for the SSDs.

SUMMARY

Embodiments of the present invention include a method for dynamic channel LLR quantization for a SSD controller. The method comprises reading a plurality of voltages from a SSD flash memory; determining an LLR for each of the plurality of voltages read, each one of the LLRs having a magnitude; scaling the magnitude of the plurality of LLRs to reach a targeted range, the scaling resulting in a set of scaled LLRs within the targeted range, the targeted range having a lower limit and an upper limit, the scaled LLRs having no distortion from the magnitude; rounding each of the set of scaled LLRs to a corresponding integer; quantizing the rounded set of scaled LLRs; applying the quantized set of scaled LLRs to a soft iterative decoding algorithm, the soft iterative decoding algorithm producing an error correction code (ECC); and correcting an error in the SSD flash memory based on the ECC.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE FIGURES

Other embodiments of the invention will become apparent.

DETAILED DESCRIPTION

Figure 1:
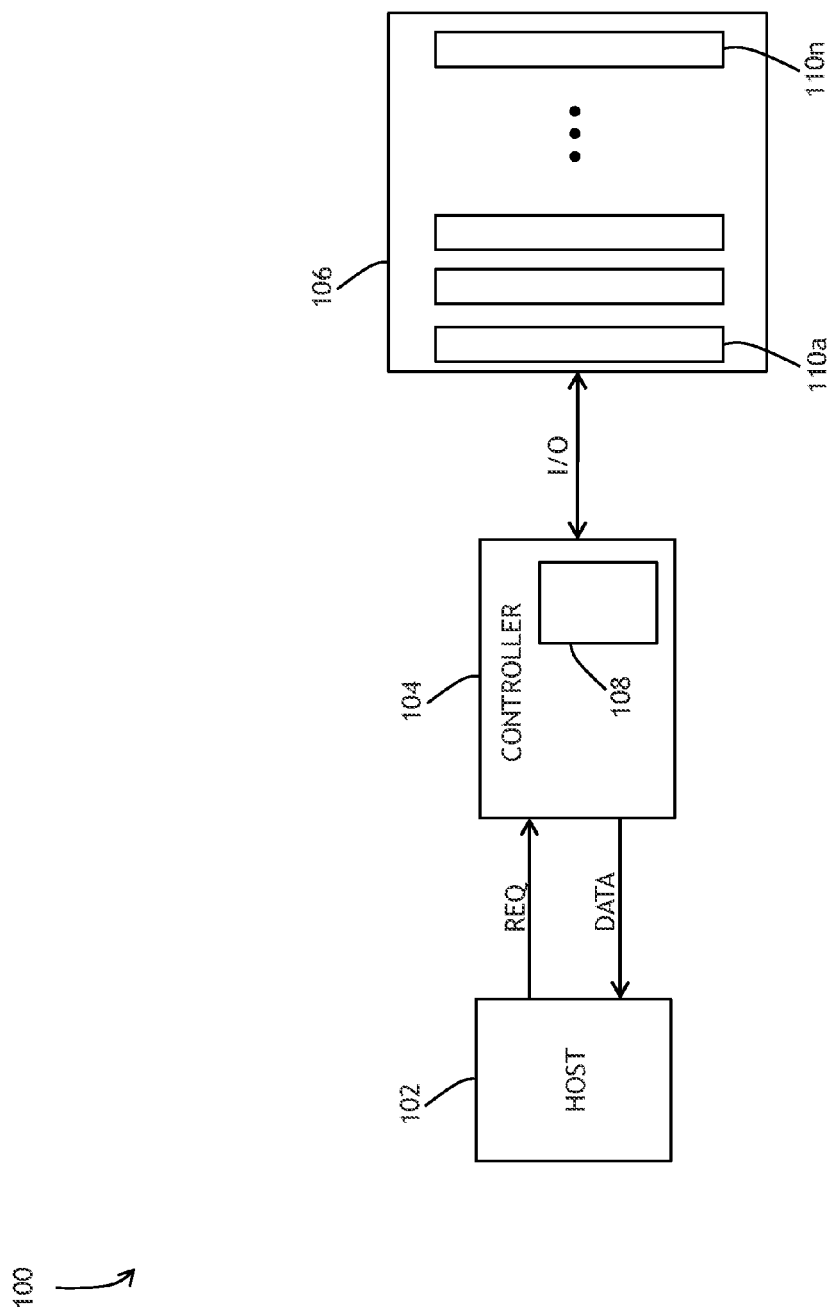
FIG. 1 is a block diagram of an exemplary system for dynamic LLR quantization in accordance with an embodiment of the present invention.

Reference will now be made in detail to the embodiments of the invention, examples of which are illustrated in the accompanying drawings.

The following description presents certain specific embodiments of the present invention. However, the present invention may be embodied in a multitude of different ways as defined and covered by the claims. In this description, reference is made to the drawings wherein like parts are designated with like numerals throughout.

Although cell voltage is continuously variable, a flash device only provides a binary hard decision after a read operation. When soft iterative decoding algorithms are used for error correction, it is desirable to convert the hard decisions generated by the flash devices into soft decisions readable by the decoder as input. The soft decisions converted from a single read may not be of sufficient quality for successful decoding. In this case, multiple reads with varying read voltages are desired to obtain sufficient quality of the soft decisions.

Embodiments of the present invention directly apply to all types of flash memory. Based on how many bits can be stored in a cell, NAND flash is categorized as Single-layer cell (SLC) characterized by a single bit per cell, Multi-layer cell (MLC) characterized by two bits per cell, Triple-layer cell (TLC) characterized by three bits per cell and 4-bit-per-cell flash devices.

Embodiments of the present invention provide for a group of seven reads per cell layer. With greater than one layer, methods herein read a pair of voltages for each layer of the cell. For example, in reading an upper page (MSB) of a MLC, one pair of voltage reads is desired to perform the methods herein.

A further embodiment of the present invention includes a computer readable medium having non-transitory computer readable program code embodied therein for dynamic channel LLR quantization for a SSD controller, the computer readable program code comprising instructions which, when executed by a computer device or processor, perform and direct the steps of: reading a plurality of voltages from a SSD flash memory; determining an LLR for each of the plurality of voltages read, each one of the LLRs having a magnitude; scaling the magnitude of the plurality of LLRs to reach a targeted range, the scaling resulting in a set of scaled LLRs within the targeted range, the targeted range having a lower limit and an upper limit, the scaled LLRs having no distortion from the magnitude; rounding each of the set of scaled LLRs to a corresponding integer; quantizing the rounded set of scaled LLRs; applying the quantized set of scaled LLRs to a soft iterative decoding algorithm, the soft iterative decoding algorithm producing an error correction code (ECC); and correcting an error in the SSD flash memory based on the ECC.

An additional embodiment of the present invention includes reading one set of seven reads for a single layer cell and at least one pair of reads for each layer of a cell. Further, the number of LLRs corresponds to the number of voltages read.

An additional embodiment of the present invention includes dynamic scaling based on the number of LLRs and the targeted range has a lower limit and an upper limit. Further, the targeted range may be based on at least one of: the number of LLRs and a greatest LLR magnitude.

Referring to FIG. 1, a block diagram of an exemplary system for dynamic LLR quantization in accordance with an embodiment of the present invention is shown. Host 102 sends a request for date to SSD controller 104. SSD controller 104 maintains the logic and commands necessary to execute methods herein. SSD controller 104 feeds Decoder 108 LLRs to produce the ECCs. Each SSD 110a-110n maintains data and is housed within SSD storage device 106. Of note, SSD 110a may be of a plurality of sizes including, but not limited to a SLC, MLC, TLC and a four-bits-per-cell SSD.

Figure 2:
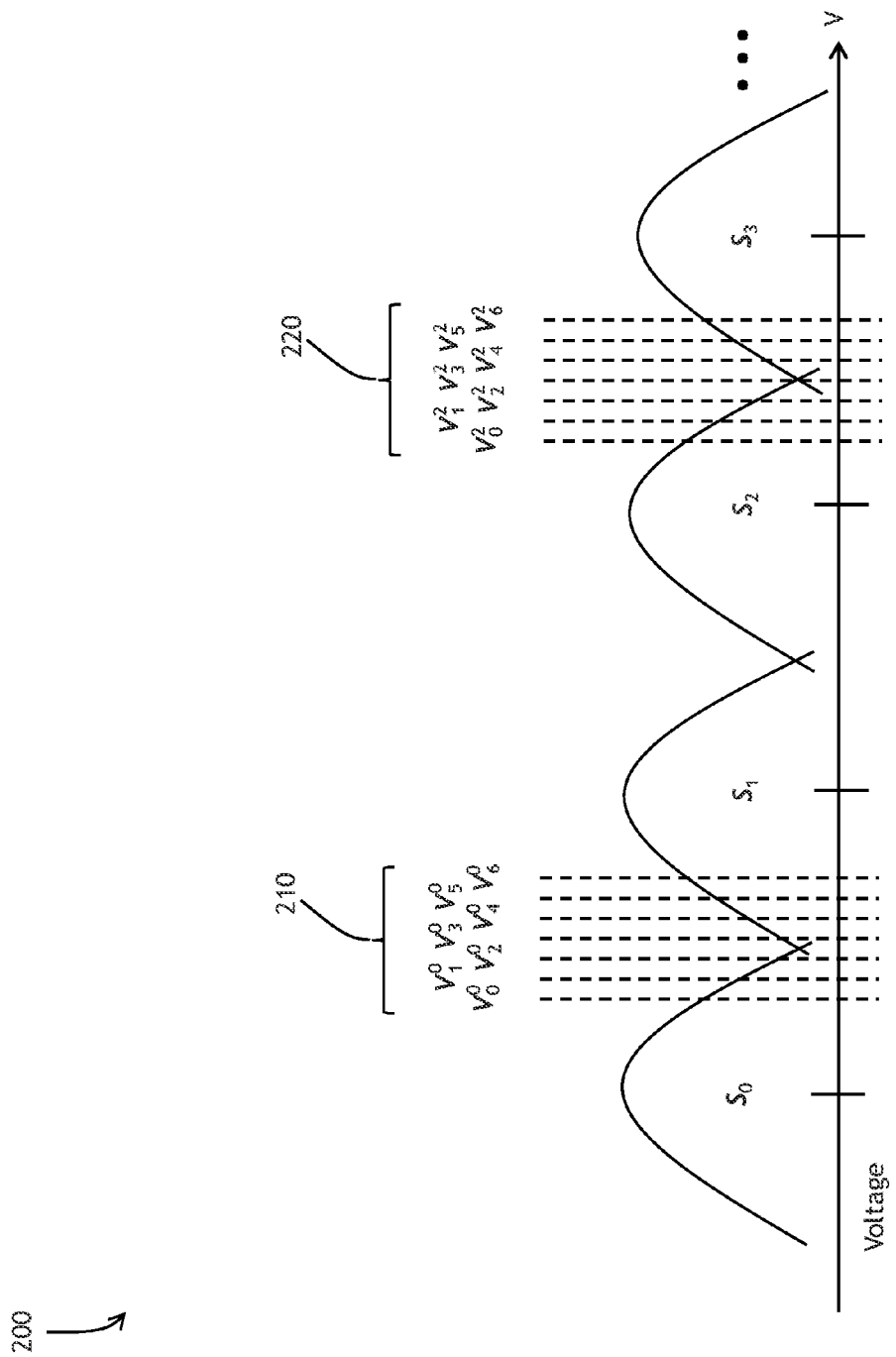
FIG. 2 is a diagram of exemplary voltage pairs read on an upper page of a MLC SSD exemplary of an embodiment of the present invention.

Referring to FIG. 2, a diagram of exemplary voltage pairs read on an upper page of a MLC SSD exemplary of an embodiment of the present invention is shown. Each pair of voltage reads ($V_0^0$ and $V_0^2$) represent the location at which the voltage of the cell is read. Location and number of reads is selected for performance of the cell. Should method 200 read a TLC, it is contemplated herein, an additional pair of reads (here 21 reads) is desired to produce correct LLRs for analysis.

Figure 3:
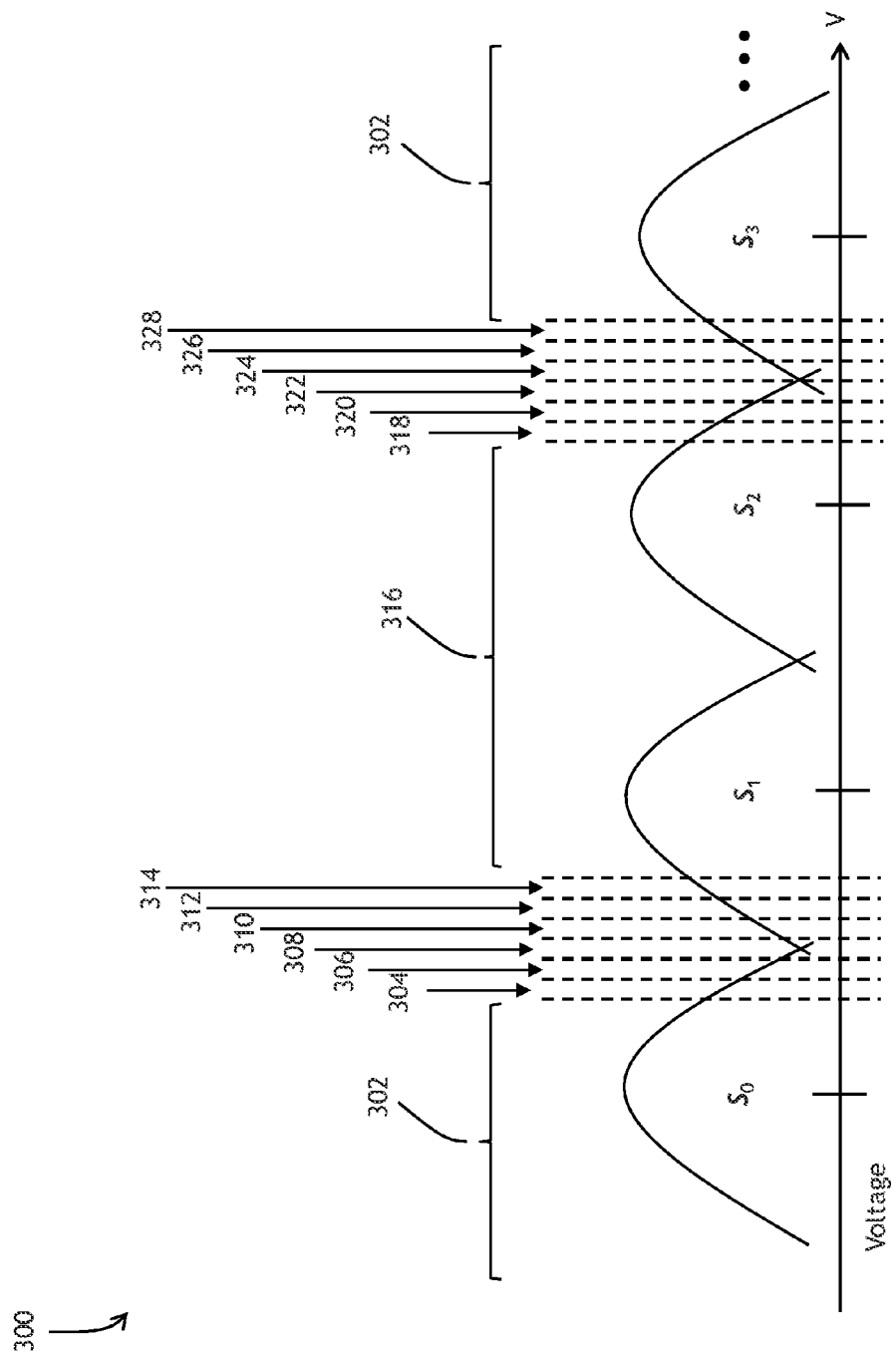
FIG. 3 is a diagram of exemplary LLR regions separated by each of the voltage reads in accordance with an embodiment of the present invention.

Referring to FIG. 3, a diagram of exemplary LLR regions separated by each of the voltage reads in accordance with an embodiment of the present invention is shown. The seven read pairs divide the voltage axis V into 15 disjoint regions. The most left and the most right regions 302 are associated to the same LLR, e.g., LLR0. Of note, a majority of cell voltages fall within three regions. Region 302, region 316 in the center, and region 302 on the right. The number of cell voltages falling within the more narrow regions (304, 306, 308, 310, 312, 314, 318, 320, 322, 324, 326, and 328) is much less, especially for the early stage of SSD life span (high SNR).

From the read voltages, method 300 calculates an LLR for each of the voltages read. From left to right in FIG. 3, there are 14 LLRs associated to the 15 regions.

Figure 4:
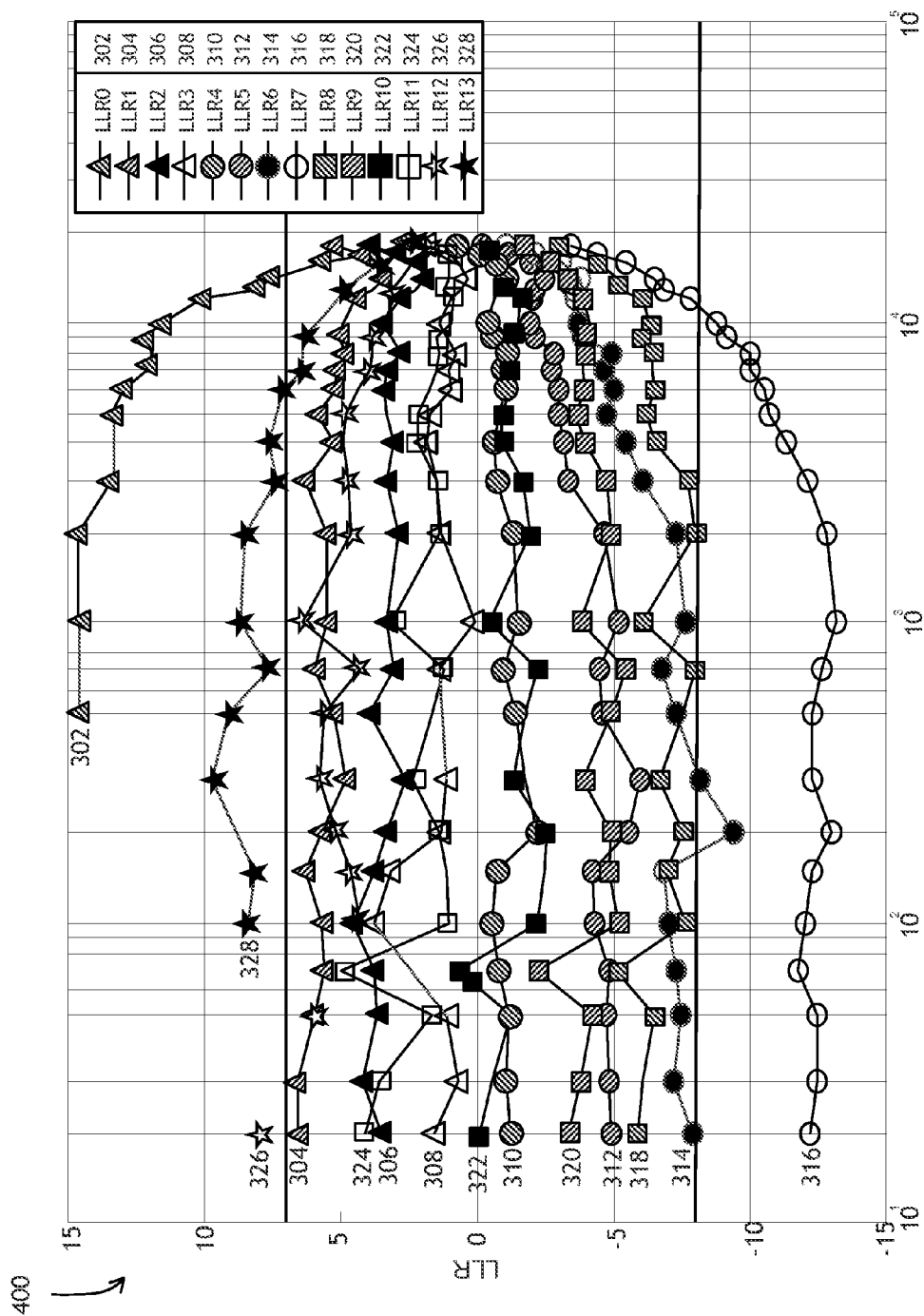
FIG. 4 is a graph of LLR vs. Program Erase Cycle (PEC) of Most Significant Bit (MSB) pages in accordance with an embodiment of the present invention ion.

Referring to FIG. 4, a graph of LLR vs. Program Erase Cycle (PEC) of Most Significant Bit (MSB) pages in accordance with an embodiment of the present invention ion is shown. As indicated, LLR 302 (LLR0) maintains greater than 15 at the early stage of the SSD life span. If not scaled, this data for LLR 302 maybe much greater than the targeted range and will therefore be clipped resulting in distorted LLRs. An unacceptable high BER will result from this lost data. Magnitude of LLR is directly proportional to the confidence in an LLR. For example, and LLR with a magnitude of 14 may possess great confidence. However, if the LLR is clipped from decoder analysis, a greater BER will result.

In embodiments, targeted scaling of the LLRs to within an upper limit and a lower limit produces a set of scaled LLRs configured for reading and use by the LLR decoder. For example, should a decoder desire LLRs between an upper limit of approximately positive six (+6) and a lower limit of approximately minus six (−6), method 400 will target this range within which the scaled set of LLRs must fall. Alternatively, should a decoder desire a greater or lesser range of scaled LLRs, method 400 will appropriately scale to reach this greater or lesser range.

Figure 5:
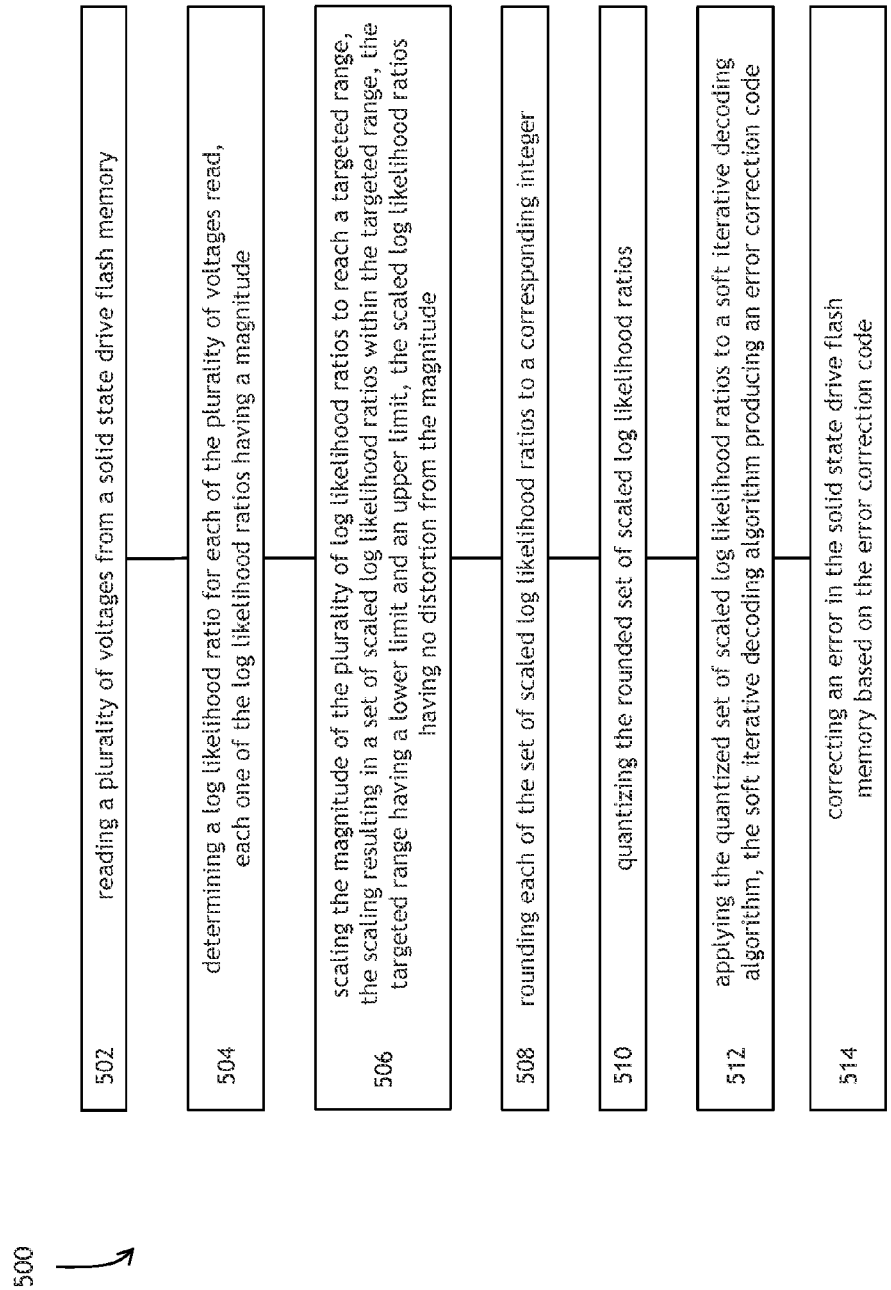
FIG. 5 is a flowchart for a method for dynamic LLR quantization in accordance with an embodiment of the present invention.

Referring to FIG. 5, a flowchart for a method for dynamic LLR quantization in accordance with an embodiment of the present invention is shown. Method 500 begins at step 502 with reading a plurality of voltages from a SSD flash memory and, at step 504, it determines an LLR for each of the plurality of voltages read, each one of the LLRs having a magnitude and, at step 506, method 500 scales the magnitude of the plurality of LLRs to reach a targeted range, the scaling resulting in a set of scaled LLRs within the targeted range, the targeted range having a lower limit and an upper limit, the scaled LLRs having no distortion from the magnitude. Method 500 continues at step 508 with rounding each of the set of scaled LLRs to a corresponding integer and, at step 510, method 500 quantizes the rounded set of scaled LLRs and, at step 512, it applies the quantized set of scaled LLRs to a soft iterative decoding algorithm, the soft iterative decoding algorithm producing an error correction code (ECC). Method 500 completes at step 514 with correcting an error in the SSD flash memory based on the ECC.

CONCLUSION

Specific blocks, sections, devices, functions, processes and modules may have been set forth. However, a skilled technologist will realize that there may be many ways to partition the method and system, and that there may be many parts, components, processes, modules or functions that may be substituted for those listed above.

While the above detailed description has shown, described and pointed out the fundamental novel features of the invention as applied to various embodiments, it will be understood that various omissions and substitutions and changes in the form and details of the method and system illustrated may be made by those skilled in the art, without departing from the intent of the invention. The foregoing description details certain embodiments of the invention. It will be appreciated, however, that no matter how detailed the foregoing appears, the invention may be embodied in other specific forms without departing from its spirit or essential characteristics. The described embodiment is to be considered in all respects only as illustrative and not restrictive and the scope of the invention is, therefore, indicated by the appended claims rather than by the foregoing description. All changes which come within the meaning and range of equivalency of the claims may be to be embraced within their scope.

In the present disclosure, the methods disclosed may be implemented as sets of instructions or software readable by a device. Further, it is understood that the specific order or hierarchy of steps in the methods disclosed may be examples of exemplary approaches. Based upon design preferences, it is understood that the specific order or hierarchy of steps in the method can be rearranged while remaining within the disclosed subject matter. The accompanying claims present elements of the various steps in a sample order, and are not necessarily meant to be limited to the specific order or hierarchy presented.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages.

The form described is merely explanatory, and it is the intention of the following claims to encompass and include such changes.

What is claimed is:

1. A method for dynamic channel log likelihood ratio quantization for a solid state drive controller, comprising:
reading a pair of voltages from a plurality of locations of a solid state drive flash memory;
determining a log likelihood ratio for each voltage of the pair of voltages read, each one of the log likelihood ratios having a magnitude;
scaling the magnitude of the plurality of log likelihood ratios to reach a targeted range based on a greatest log likelihood ratio magnitude, the scaling resulting in a set of scaled log likelihood ratios within the targeted range, the targeted range having a lower limit and an upper limit, the scaled log likelihood ratios having no distortion from a respective magnitude;
rounding each of the set of scaled log likelihood ratios to a corresponding integer;
quantizing the rounded set of scaled log likelihood ratios;
applying the quantized set of scaled log likelihood ratios to a soft iterative decoding algorithm, the soft iterative decoding algorithm producing an error correction code; and
correcting an error in the solid state drive flash memory based on the error correction code.

2. The method for dynamic channel log likelihood ratio quantization for a solid state drive controller of claim 1, wherein reading the pair of voltages from the plurality of locations of the solid state drive flash memory further comprises reading one set of seven reads per layer of a multi-layer cell (MLC).

3. The method for dynamic channel log likelihood ratio quantization for a solid state drive controller of claim 1, wherein reading the pair of voltages from the solid state drive flash memory further comprises reading at least one pair of reads for each layer of a multi-layer cell (MLC) or a triple-layer cell (TLC), and wherein a location and a number of the reads for the respective pair is selectable based on a performance of the flash memory cell.

4. The method for dynamic channel log likelihood ratio quantization for a solid state drive controller of claim 1, wherein determining the log likelihood ratio for each voltage of the pair of voltages read further comprises determining a number of log likelihood ratios, the number of log likelihood ratios corresponding to the number of voltages read.

5. The method for dynamic channel log likelihood ratio quantization for a solid state drive controller of claim 4, wherein scaling the magnitude of the plurality of log likelihood ratios to reach the targeted range further comprises dynamic scaling based on the number of log likelihood ratios.

6. The method for dynamic channel log likelihood ratio quantization for a solid state drive controller of claim 4, wherein the targeted range is further based on the number of log likelihood ratios.

7. A computer readable medium having non-transitory computer readable program code embodied therein for dynamic channel log likelihood ratio quantization for a solid state drive controller, the computer readable program code comprising instructions which, when executed by a computer device or processor, perform and direct the steps of:
reading a pair of voltages from a plurality of locations of a solid state drive flash memory;
determining a log likelihood ratio for each voltage of the pair of voltages read, each one of the log likelihood ratios having a magnitude;
scaling the magnitude of the plurality of log likelihood ratios to reach a targeted range based on a greatest log likelihood ratio magnitude, the scaling resulting in a set of scaled log likelihood ratios within the targeted range, the targeted range having a lower limit and an upper limit, the scaled log likelihood ratios having no distortion from a respective magnitude;
rounding each of the set of scaled log likelihood ratios to a corresponding integer;
quantizing the rounded set of scaled log likelihood ratios;
applying the quantized set of scaled log likelihood ratios to a soft iterative decoding algorithm, the soft iterative decoding algorithm producing an error correction code (ECC); and
correcting an error in the solid state drive flash memory based on the ECC.

8. The computer readable medium of claim 7, wherein reading the pair of voltages from the solid state drive flash memory further comprises reading one set of seven reads per layer of a multi-layer cell (MLC).

9. The computer readable medium of claim 7, wherein reading the pair of voltages from the plurality of locations of the solid state drive flash memory further comprises reading at least one pair of reads for each layer of a multi-layer cell (MLC) or a triple-layer cell (TLC), wherein a location and a number of the reads for the at least one pair of reads is selectable based on a performance of the flash memory cell.

10. The computer readable medium of claim 7, wherein determining the log likelihood ratio for each voltage of the pair of voltages read comprises determining a number of log likelihood ratios, the number of log likelihood ratios corresponding to the number of voltages read.

11. The computer readable medium of claim 10, wherein scaling the magnitude of the plurality of log likelihood ratios to reach the targeted range further comprises dynamic scaling based on the number of log likelihood ratios.

12. The computer readable medium of claim 10, wherein the targeted range is further based on the number of log likelihood ratios.

13. A method for log likelihood quantization and error correction in a flash device comprising:
converting a plurality of hard decisions generated by a flash device into soft decisions readable by a decoder comprising:
reading a set of voltages from a plurality of locations of the flash device;
determining a log likelihood ratio for each voltage of the set of voltages read, each one of the log likelihood ratios having a magnitude;
scaling the magnitude of the plurality of log likelihood ratios to within an upper limit and a lower limit of a targeted range based on a greatest log likelihood ratio magnitude, the scaled log likelihood ratios having no distortion from a respective magnitude;
rounding each of the set of scaled log likelihood ratios to a corresponding integer; and
quantizing the rounded set of scaled log likelihood ratios;
decoding the quantized set of scaled log likelihood ratios with the decoder, wherein the decoder is a soft iterative decoder with one or more soft iterative decoding algorithms configured to produce an error correction code (ECC); and
correcting an error in the flash device based on the ECC.

14. The method of claim 13, wherein the flash device implements a single-layer cell (SLC), and wherein reading the set of voltages from the plurality of locations of the flash device comprises reading one set of seven reads for the SLC.

15. The method of claim 13, wherein the flash device implements at least one of a multi-layer cell (MLC) or a triple-layer cell (TLC), and wherein reading the set of voltages from the plurality of locations of the flash device comprises reading at least one set of voltages for each layer implemented in the flash device.

16. The method of claim 13, wherein determining the log likelihood ratio for each voltage of the set of voltages read comprises determining a number of log likelihood ratios, the number of log likelihood ratios corresponding to the number of voltages read.

17. The method of claim 16, wherein scaling the magnitude of the plurality of log likelihood ratios to reach the targeted range comprises dynamic scaling based on the number of log likelihood ratios.

18. The method of claim 16, wherein the targeted range is further based on the number of log likelihood ratios.

19. The method of claim 18 implemented in a computer readable medium having non-transitory computer readable program code embodied therein for dynamic channel log likelihood ratio quantization for a solid state drive controller.

20. The method of claim 13, wherein a location and a number of the reads for the set of voltages read is selectable based on a performance of the flash memory cell.

* * * * *